United States Patent
Matsumoto et al.

(10) Patent No.: US 6,482,266 B1
(45) Date of Patent: Nov. 19, 2002

(54) METAL ORGANIC CHEMICAL VAPOR DEPOSITION METHOD AND APPARATUS

(75) Inventors: Kenji Matsumoto, Yamanashi (JP); Hiroshi Shinriki, Chiba (JP)

(73) Assignee: Tokyo Electron Limted, Tokyo (JP)

( * ) Notice: Subject to any disclaimer, the term of this patent is extended or adjusted under 35 U.S.C. 154(b) by 49 days.

(21) Appl. No.: 09/598,247

(22) Filed: Jun. 21, 2000

(30) Foreign Application Priority Data

Jun. 22, 1999 (JP) .......................................... 11-175076

(51) Int. Cl.[7] ........................... C23C 16/00; H05H 1/02
(52) U.S. Cl. ...................... 118/715; 118/726; 118/712; 427/250
(58) Field of Search ................................ 118/715, 726, 118/724, 695, 712; 427/250, 585

(56) References Cited

U.S. PATENT DOCUMENTS 5,460,654 A  * 10/1995 Kikkawa et al. ............ 118/726
5,575,854 A  * 11/1996 Jinnouchi et al. ........... 118/715
5,648,114 A  *  7/1997 Araujo et al. ............. 427/126.3

FOREIGN PATENT DOCUMENTS

JP 62-273714 A * 11/1987 ......... H01L/21/205
JP 4-362176     12/1992

OTHER PUBLICATIONS

Amanuma et al.; "Capacitor–on–Metal/Via–stacked–Plug (CMVP) Memory Cell for 0.25 μm CMOS Embedded FeRAM", IEEE, (1998).

* cited by examiner

*Primary Examiner*—Gregory Mills
*Assistant Examiner*—P. Hassanzadeh
(74) *Attorney, Agent, or Firm*—Finnegan Henderson Farabow Garrett & Dunner, L.L.P.

(57) ABSTRACT

In a metal organic chemical vapor deposition method, a parameter convertible into the number of moles of gas of an organometallic source supplied from at least one source vessel is detected. A source contained in the source vessel is heated when the parameter becomes smaller than a minimum value necessary for forming a thin film of a metal constituting the organometallic source on a substrate in a reactor. The gas of the organometallic source is quantitatively supplied to the reactor, thereby forming the thin film on the substrate. A metal organic chemical vapor deposition apparatus is also disclosed.

20 Claims, 9 Drawing Sheets

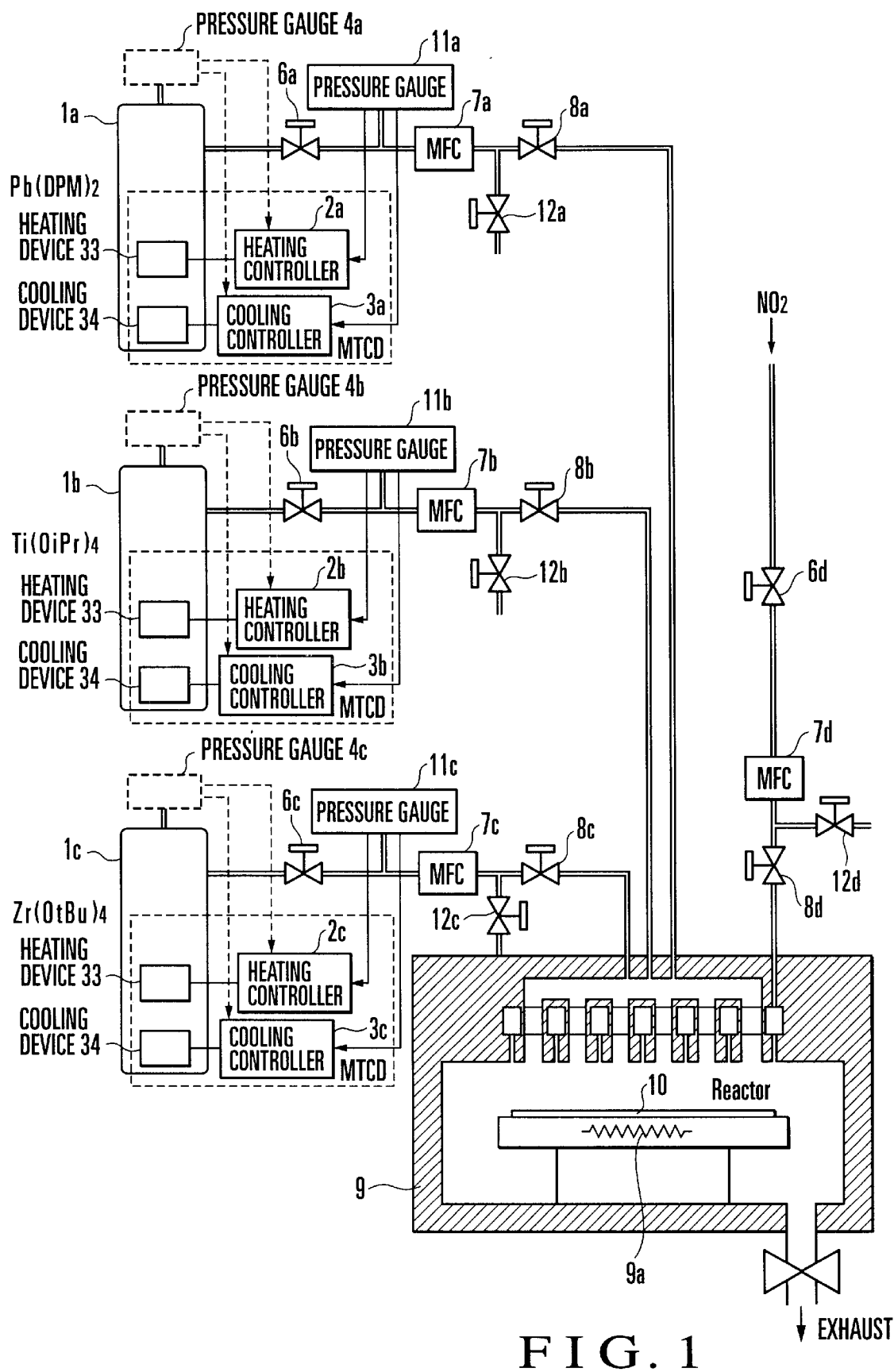
F I G. 1

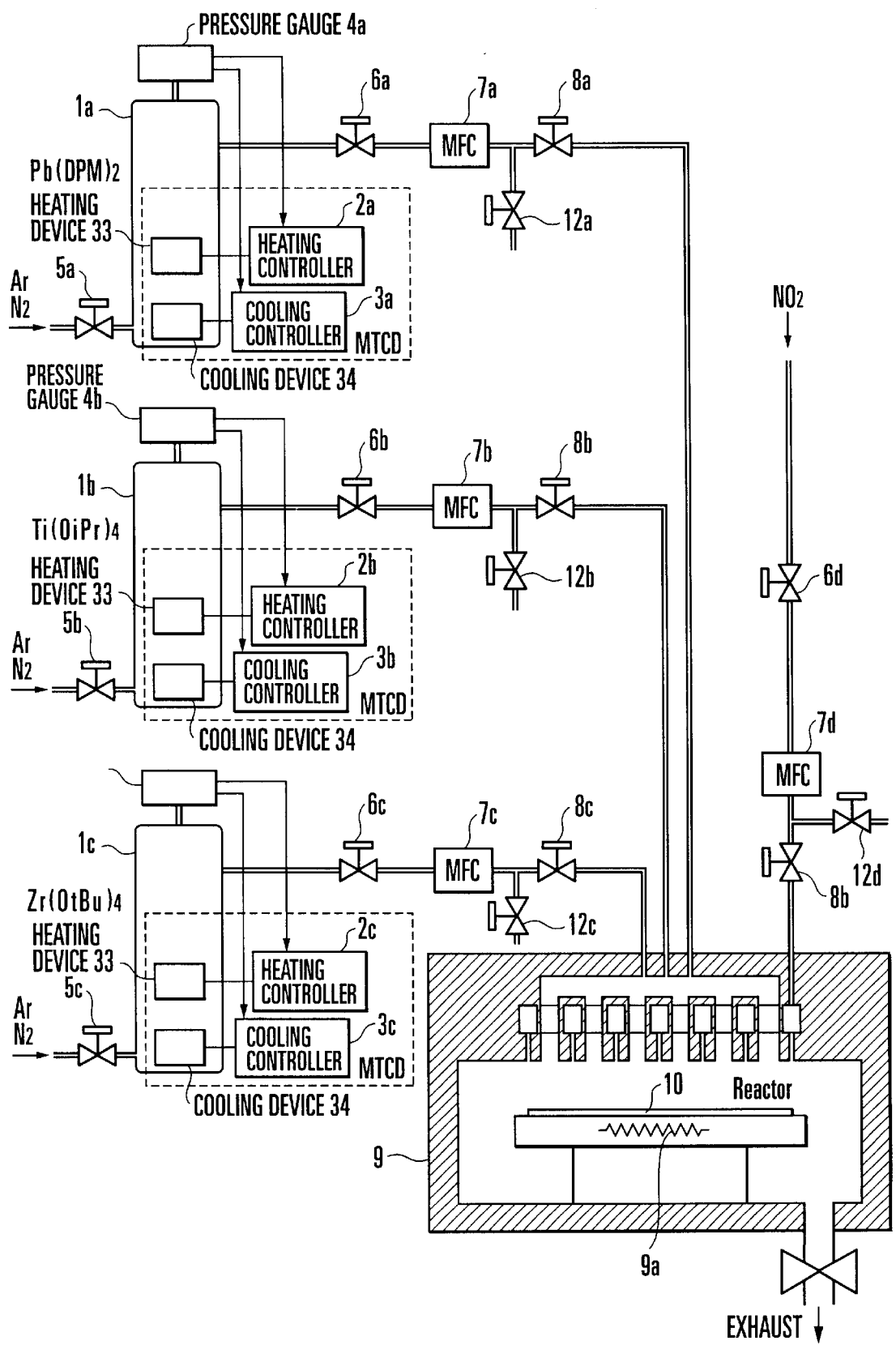
F I G. 4

METAL ORGANIC CHEMICAL VAPOR DEPOSITION METHOD AND APPARATUS

BACKGROUND OF THE INVENTION

The present invention relates to a chemical vapor deposition method and apparatus and, more particularly, to a metal organic chemical vapor deposition method and apparatus using an organic metal as a source to form on a substrate a thin film made of a metal constituting the source.

There is a conventionally known chemical vapor deposition method such as MOCVD (Metal Organic Chemical Vapor Deposition) for forming a thin film of a metal or metal oxide on a substrate using chemical reaction of the vapor phase.

FIG. 8 shows an example of a conventional MOCVD apparatus (Metal Organic Chemical Vapor Deposition apparatus). The MOCVD apparatus shown in FIG. 8 forms a PZT film on a substrate 10 in an evacuated reactor 9. Source vessels 1a, 1b, and 1c are respectively heated by temperature controllers 801a, 801b, and 801c to predetermined temperatures, thereby gasifying a lead dipivaloyl methanato complex $Pb(DPM)_2$, an organometallic compound source $Ti(O-i-Pr)_4$, and an organometallic compound source $Zr(O-t-Bu)_4$.

The $Pb(DPM)_2$, $Ti(O-i-Pr)_4$, and $Zr(O-t-Bu)_4$ gases are introduced into the reactor 9 together with an oxide gas such as $NO_2$ or $O_2$ gas to form a PZT film on the substrate 10 using chemical reaction of the vapor phase.

At this time, the flow rates of $Pb(DPM)_2$, $Ti(O-i-Pr)_4$, $Zr(O-t-Bu)_4$, and $NO_2$ gases are respectively controlled by mass-flow controllers (MFCs) 7a, 7b, 7c65, and 7d arranged midway along gas supply paths extending to the reactor 9.

In the MOCVD apparatus shown in FIG. 8, the respective source gases must be introduced to corresponding MFCs at predetermined vapor pressures in order to cause chemical reaction of the vapor phase in the reactor 9. To obtain necessary source vapor pressures, the source vessels 1a, 1b, and 1c are kept at predetermined temperatures.

However, the temperatures are set when respective sources are fully filled in the source vessels 1a, 1b, and 1c. As the sources in the source vessels 1a, 1b, and 1c are gasified and supplied to the reactor 9, the amounts of sources gradually decrease. As the amounts of sources in the source vessels 1a, 1b, and 1c decrease, the source vessels fail to maintain the necessary source vapor pressures.

The same problem arises even when a carrier gas such as He, Ar, or $N_2$ gas is introduced into the source vessel to carry source gases to the reactor 9 by this carrier gas in order to assure predetermined source flow rates. That is, as the amounts of sources in the source vessels decrease upon use, necessary source vapor pressures cannot be maintained, and control of the source flow rates becomes unstable.

To compensate for variations in supply vapor pressure caused by residue variations in the source vessel, for example, an MOCVD apparatus disclosed in Japanese Patent Laid-Open No. 4-362176 is proposed. The MOCVD apparatus described in this reference will be explained with reference to a basic arrangement shown in FIG. 9. In this MOCVD apparatus shown in FIG. 9, pentaethoxy tantalum $(Ta(OC_2H_5)_5)$ serving as an organometallic source bubbled with oxygen and nitrogen for forming an oxygen atmosphere is introduced into a reactor 51 evacuated by a vacuum pump 54. In this case, the flow rate of oxygen introduced into the reactor 51 and that of nitrogen introduced into a material vessel 55 are controlled by signals sent from a flow controller 61 to mass-flow controllers 58.

Pentaethoxy tantalum used in the MOCVD apparatus of FIG. 9, which is a liquid at room temperature, is introduced as a vapor into the reactor 51 by heating the whole material vessel 55 to a temperature of, e.g., 100° C. by thermostatic heaters 57, and bubbling pentaethoxy tantalum with nitrogen introduced into the material vessel 55. To prevent pentaethoxy tantalum and nitrogen from liquefying through a gas supply path or pipe extending from the material vessel 55 to the reactor 51, the gas supply path or pipe is heated by gas pipe heaters 56. The gas pipe heaters 56 and the thermostatic heaters 57 are respectively controlled by temperature controllers 59 and 60 which receive outputs from a quadrupole spectrometer 62 (to be described below).

Oxygen and pentaethoxy tantalum introduced into the reactor 51 thermally react by heat energy supplied from an electric furnace 53 surrounding the reactor 51. As a result, a tantalum oxide film $Ta_2O_5$ is formed on a substrate 52 placed inside the reactor 51.

The quadrupole spectrometer 62 connected to the reactor 51 detects the concentrations of oxygen and pentaethoxy tantalum introduced into the reactor 51, and outputs an electrical signal when the mass number of pentaethoxy tantalum is around "405". If the concentration of pentaethoxy tantalum represented by the magnitude of the electrical signal is higher than a predetermined value, the temperature controller 59 of the gas pipe heaters 56 and the temperature controller 60 of the thermostatic heaters 57 decrease the temperature of the gas pipe heaters 56 and that of the thermostatic heaters 57. At the same time, the flow controller 61 causes the mass-flow controller 58 to decrease the flow rate of bubbling nitrogen, thereby decreasing the supply amount of pentaethoxy tantalum to the reactor 51. The operation of decreasing the supply amount of pentaethoxy tantalum to the reactor 51 is kept performed until the concentration of pentaethoxy tantalum represented by an electrical signal from the quadrupole spectrometer 62 reaches a desired concentration.

To the contrary, if the concentration of pentaethoxy tantalum represented by an electrical signal from the quadrupole spectrometer 62 is lower than a desired concentration, the supply amount of pentaethoxy tantalum to the reactor 51 is increased under reverse control.

However, various limitations are imposed on the MOCVD apparatus shown in FIG. 9 owing to the use of the quadrupole spectrometer 62 as a measuring device. The usable vacuum degree of the quadrupole spectrometer is structurally limited to a high vacuum range of about $10^{-5}$ torr or more. The vacuum degree, although it depends on the process, in the reactor during chemical vapor deposition need not be so high, and is as high as about $10^{-1}$ torr at most. To use the quadrupole spectrometer in this pressure range, a high-vacuum pump such as a turbo molecular pump must be adopted in addition to a reactor exhaust pump to differentially evacuate the reactor.

Hence, when the source concentration in the reactor during the chemical vapor deposition process is to be measured using the quadrupole spectrometer, like the apparatus shown in FIG. 9, the exhaust structure around the reactor becomes inevitably complicated. Even if the quadrupole spectrometer is installed using this structure, a gas component in the reactor is not necessarily the same as a gas component which reaches the quadrupole spectrometer. In addition, some of sources introduced into the reactor are decomposed by a high-temperature wafer heating device, which must be considered. For this reason, it is not practical to compensate for residue variations in the reactor by measuring the source concentration in the reactor during chemical vapor deposition using the quadrupole spectrometer.

SUMMARY OF THE INVENTION

It is an object of the present invention to provide a metal organic chemical vapor deposition method and apparatus capable of forming a desired organometallic film by supplying a necessary organometallic source gas more stably than the conventional apparatus.

To achieve the above object, according to one aspect of the present invention, there is provided a metal organic chemical vapor deposition method, comprising the steps of detecting a parameter convertible into the number of moles of gas of an organometallic source supplied from at least one source vessel, heating a source contained in the source vessel when the parameter becomes smaller than a minimum value necessary for forming a thin film of a metal constituting the organometallic source on a substrate in a reactor, and quantitatively supplying the gas of the organometallic source to the reactor, thereby forming the thin film on the substrate.

According to another aspect of the present invention, there is provided a metal organic chemical vapor deposition apparatus, comprising at least one source vessel for supplying gas of an organometallic source, detection means for detecting a parameter convertible into the number of moles of the gas of the organometallic source supplied from the source vessel, and source temperature adjustment means for heating the organometallic source contained in the source vessel when the parameter detected by the detection means becomes smaller than a minimum value necessary for forming a thin film of a metal constituting the organometallic source on a substrate in a reactor, wherein the gas of the organometallic source is quantitatively supplied to the reactor, thereby forming the thin film on the substrate.

BRIEF DESCRIPTION OF THE DRAWINGS

FIG. 1 is a system diagram showing the basic arrangement of the first embodiment for explaining a metal organic chemical vapor deposition method and apparatus according to the present invention;

FIG. 4 is a system diagram showing the second embodiment for explaining the present invention;

DESCRIPTION OF THE PREFERRED EMBODIMENTS

First Embodiment

Figure 2A:
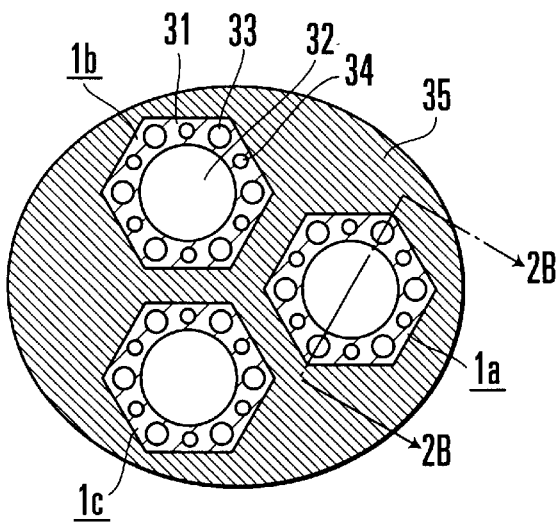
FIGS. 2A and 2B are a cross-sectional view of a source vessel shown in FIG. 1, and a longitudinal sectional view taken along the line 2B—2B, respectively.

FIG. 1 shows the basic arrangement of the first embodiment for explaining a metal organic chemical vapor deposition (MOCVD) method and apparatus according to the present invention.

In FIG. 1, reference numerals 1a, 1b, and 1c denote source vessels each having an internal volume of about 1 l. The source vessel 1a contains a lead dipivaloyl methanato complex $Pb(DPM)_2$; the source vessel 1b, an organometallic compound source $Ti(O-i-Pr)_4$; and the source vessel 1c, an organometallic compound source $Zr(O-t-Bu)_4$.

Reference numerals 2a, 2b, and 2c denote heating controllers for controlling heating devices 33 attached to the source vessels 1a, 1b, and 1c, respectively; and 3a, 3b, and 3c, cooling controllers for controlling cooling devices 34 of the source vessels 1a, 1b, and 1c. Each heating device 33 and each cooling device 34 heats and cools a source gas stored in a corresponding source vessel. This processing ON/OFF-controls a source gas discharged from each source vessel so as to be supplied to the output stage at a predetermined pressure (to be described later). This control can improve the precision using, e.g., PID control.

Figure 2B:
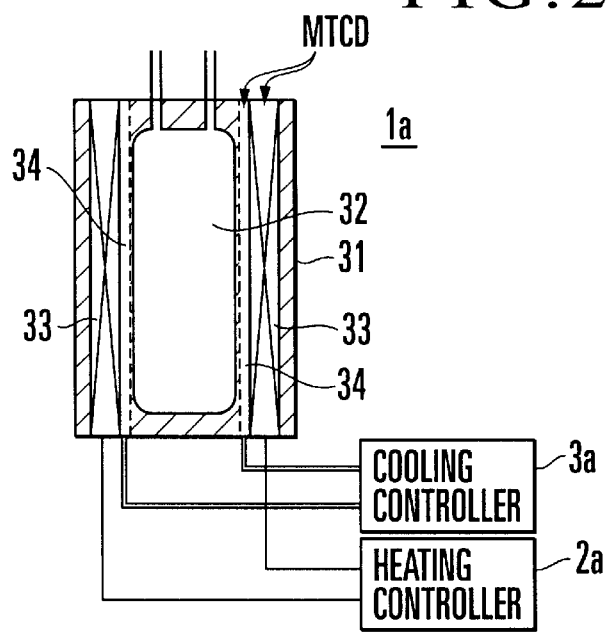

Hence, the heating device 33 and the cooling device 34 constitute a source temperature adjustment device MTCD for adjusting a source gas discharged from each source vessel to a predetermined pressure. FIGS. 2A and 2B show an example of the heating device 33 and cooling device 34 constituting the source temperature adjustment device MTCD, which will be described in detail below.

Reference numerals 4a, 4b, and 4c denote pressure gauges such as baratrons for measuring the internal source vapor pressures of the source vessels 1a, 1b, and 1c; 6a, 6b, and 6c, valves attached to the gas outlets of the source vessels 1a, 1b, and 1c; 7a, 7b, 7c, and 7d, mass-flow controllers (to be simply referred to as MFCs hereinafter) for controlling the flow rates of $Pb(DPM)_2$, $Ti(O-i-Pr)_4$, $Zr(O-t-Bu)_4$ gases discharged from the valves 6a, 6b, and 6c, and the flow rate of $NO_2$ gas; and 8a, 8b, 8c, and 8d, valves arranged midway along gas pipes between the MFCs 7a, 7b, 7c, and 7d and a reactor.

Reference numeral 9 denotes a reactor connected to the gas pipes extending from the valves 8a, 8b, 8c, and 8d; 10, a substrate made of a semiconductor or another known material placed inside the reactor 9; 11a, 11b, and 11c, pressure gauges such as baratrons arranged midway along gas pipes between the source vessels 1a, 1b, and 1c and the MFCs 7a, 7b, and 7c; 12a, 12b, and 12c, exhaust valves; and 9a, a heater housed in the reactor 9 to heat the substrate 10.

The lead dipivaloyl methanato complex $Pb(DPM)_2$ used in the first embodiment is solid at room temperature, whereas the organometallic compound sources $Ti(O-i-Pr)_4$ and $Zr(O-t-Bu)_4$ are liquids having high viscosity at room temperature. These sources are generally gasified into source gases by heating the source vessels 1a, 1b, and 1c, and these gases are supplied to the output stage. For example, when the source vessel 1a is fully filled with $Pb(DPM)_2$, the vapor pressure of $Pb(DPM)_2$ increases to about 2.67 Pa by heating to 110° C., about 74.7 Pa by heating to 150° C., and about 667 Pa by heating to 200° C.

FIGS. 2A and 2B show an example of the source temperature adjustment device. This example shows a detailed structure using the heating and cooling devices.

More specifically, FIG. 2A shows the source vessels 1a, 1b, and 1c taken in the horizontal direction, and FIG. 2B shows the source vessels 1a, 1b, and 1c taken in the vertical direction along the line 2B—2B. Since the source vessels 1a, 1b, and 1c have the same structure, the source vessel 1a will be representatively described.

The source vessel 1a uses an aluminum (Al) housing 31. The housing 31 is made of aluminum because aluminum exhibits high thermal conductivity and high processability. A cavity 32 for storing a source is formed inside the housing 31. The cavity 32 is surrounded by the heating device 33 such as a heater for heating a source stored in the cavity 32, and the cooling device 34 comprised of a cooling pipe for circulating a refrigerant such as silicone oil or air. Note that the heating device 33 is assembled in the wall of the housing 31 in FIG. 2B, but is not limited to this.

The heating controller 2a supplies a current to the heating device 33 to heat the source vessel 1a by the heating device 33, thereby controlling a source gas filled in the source vessel to a predetermined pressure. The cooling controller 3a controls the temperature of the pipe 34 and that of a refrigerant flowing through the pipe 34 to control the source gas filled in the source vessel 1a to a predetermined pressure.

Figure 2C:
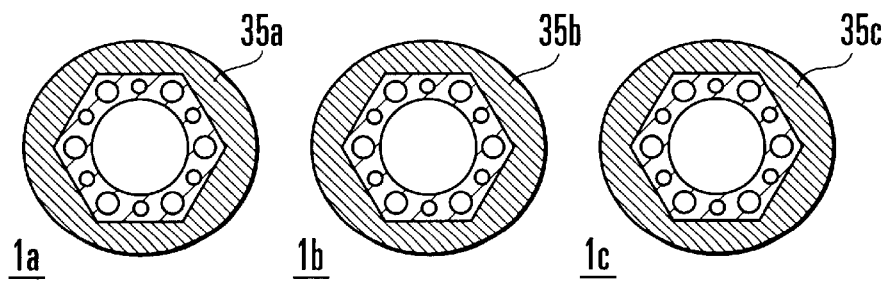
FIG. 2C is cross-sectional views of source vessels shown in FIG. 1, according to an alternative embodiment.

As shown in FIG. 2A, a plurality of source vessels 1a, 1b, and 1c are arranged close to each other, and wrapped in a single heat insulator 35 to reduce heat dissipation, which can implement a very economical source vessel. Alternatively, the source vessels 1a, 1b, and 1c may be separately wrapped in heat insulators 35a, 35b, and 35c, as shown in FIG. 2C.

A process of forming a PZT film as a thin film made of a metal constituting an organometallic source using the metal organic chemical vapor deposition apparatus having the above arrangement will be described with reference to FIG. 1.

The source vessel 1a is heated by the source temperature adjustment device MTCD to gasify a lead dipivaloyl methanato complex $Pb(DPM)_2$ which is solid at room temperature. At the same time, the source vessels 1b and 1c are heated to gasify organometallic compound sources $Ti(O-i-Pr)_4$ and $Zr(O-t-Bu)_4$.

The substrate 10 in the evacuated reactor 9 is heated to a predetermined temperature by the heater 9a.

Then, the valves 6a and 8a are opened to introduce $Pb(DPM)_2$ gas from the source vessel 1a into the reactor 9 via the valve 6a, MFC 7a, and valve 8a. Simultaneously when $Pb(DPM)_2$ gas is introduced into the reactor 9, the valves 6b and 8b are opened to introduce $Ti(O-i-Pr)_4$ gas from the source vessel 1b into the reactor 9 via the valve 6b, MFC 7b, and valve 8b. The valves 6c and 8c are opened to introduce $Zr(O-t-Bu)_4$ gas from the source vessel 1c into the reactor 9 via the valve 6c, MFC 7c, and valve 8c. At the same time as this processing, $NO_2$ gas is also introduced into the reactor 9 via a valve 6d, the MFC 7d, and the valve 8d.

The flow rates of $Pb(DPM)_2$, $Ti(O-i-Pr)_4$, $Zr(O-t-Bu)_4$, and $NO_2$ gases are respectively controlled by the MFCs 7a, 7b, 7c, and 7d in consideration of characteristics demanded for a PZT film to be formed on the substrate 10.

As a result, a PZT film ($PbZr_xTi_{1-x}O_3$ film) having a perovskite structure is formed on the substrate 10.

The role of the exhaust valves 12a, 12b, 12c, and 12d will be explained. The above-mentioned chemical vapor deposition process for a PZT film requires a given period of time until the operations of the MFCs 7a, 7b, 7c, and 7d stabilize. Until the operations of the MFCs 7a, 7b, 7c, and 7d stabilize, the exhaust valves 12a, 12b, 12c, and 12d are opened, and the valves 8a, 8b, 8c, and 8d are closed to discharge, from the exhaust valves 12a, 12b, 12c, and 12d, gases supplied from the MFCs 7a, 7b, 7c, and 7d to the output stages so as to prevent the gases from entering the reactor 9. After the operations of the MFCs 7a, 7b, 7c, and 7d stabilize, the exhaust valves 12a, 12b, 12c, and 12d are closed, and the valves 8a, 8b, 8c, and 8d are opened to introduce the gases to the reactor 9.

This chemical vapor deposition process is characterized by the first embodiment in that the source vapor pressure of each source gas is measured during the process, and the temperature of the source vessel is controlled to maintain the source vapor pressure of each source gas at a predetermined pressure on the basis of the measurement value.

In other words, in the chemical vapor deposition process, the pressure gauge 11a measures the source vapor pressure of a source gas in a gas pipe extending from the source vessel 1a to the MFC 7a. The pressure gauge 11b measures the source vapor pressure of a source gas in a gas pipe extending from the source vessel 1b to the MFC 7b. The pressure gauge 11c measures the source vapor pressure of a source gas in a gas pipe extending from the source vessel 1c to the MFC 7c.

The measurement value of the pressure gauge 11a is fed back to the controllers 2a and 3a; that of the pressure gauge 11b, to the controllers 2b and 3b; and that of the pressure gauge 11c, to the controllers 2c and 3c.

The controllers 2a and 3a control the temperature of the source vessel 1a based on the measurement value of the pressure gauge 11a so as to set, to a predetermined pressure, the source vapor pressure of a source gas supplied from the source vessel 1a to the MFC 7a. Similarly, the controllers 2b and 3b control the temperature of the source vessel 1b based on the measurement value of the pressure gauge 11b so as to set, to a predetermined pressure, the vapor pressure of a source supplied from the source vessel 1b. The controllers 2c and 3c control the temperature of the source vessel 1c based on the measurement value of the pressure gauge 11c so as to set, to a predetermined pressure, the source vapor pressure of a source gas supplied from the source vessel 1c.

Figure 3:
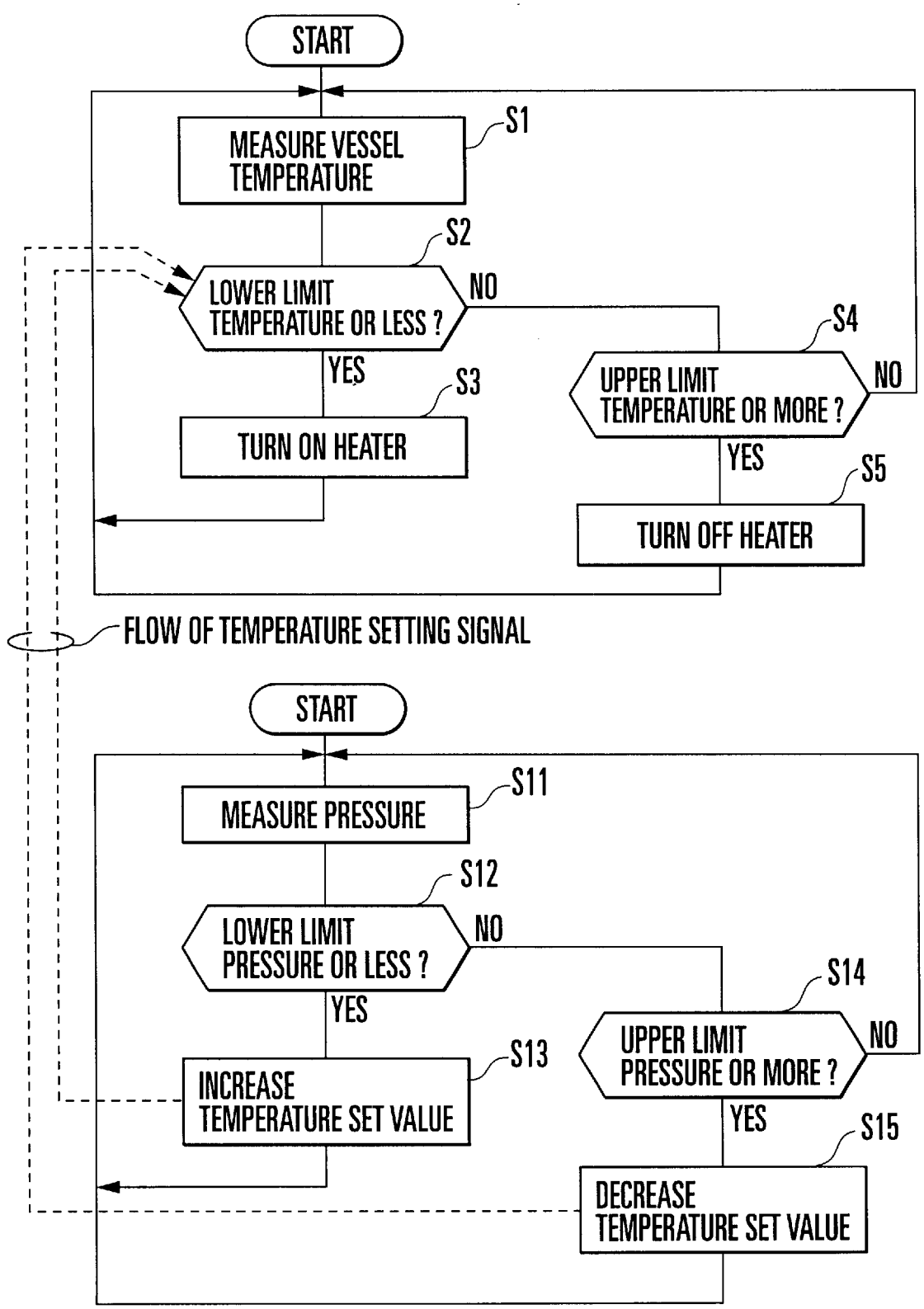
FIG. 3 is a flow chart showing temperature adjustment operation in the first embodiment of the present invention.

This control will be explained with reference to a flow chart in FIG. 3. In temperature control in the source vessel, the temperature of the source vessel is measured in step S1, and whether the measured temperature is equal to or lower than a set lower limit temperature is checked in step S2. If YES in step S2, the flow shifts to step S3 to operate the heater for heating the source vessel, and then returns to step S1. If NO in step S2, the flow shifts to step S4 to check whether the measured temperature is equal to or higher than an upper limit temperature. If YES in step S4, the flow advances to step S5 to stop the operation of the heater, and returns to step S1. If NO in step S4, the flow returns to step S1.

The pressure is measured by the pressure gauge in step S11, and whether the measured pressure is equal to or lower than a lower limit pressure is checked in step S12. If YES in step S12, the flow progresses to step S13 to increase the set value of the lower limit temperature in step S2, and returns to step S11. If NO in step S12, the flow progresses to step S14 to check whether the measured pressure is equal to or higher than an upper limit pressure. If YES in step S14, the flow shifts to step S15 to decrease the set value of the lower limit temperature in step S2, and returns to step S11. If NO in step S14, the flow returns to step S11.

The source used in MOCVD decomposes at an excessively high temperature, so that this control prevents the temperature from increasing to a temperature at which the source in each source vessel decomposes.

By keeping the source gas supplied from each source vessel at a stable pressure, the source gas can always be supplied to the output stage at a stable flow rate.

When the MFCs 7a, 7b, and 7c are arranged on the output stages of the source vessels, like the first embodiment, the MFCs 7a, 7b, and 7c can operate stably.

In this embodiment, the pressure gauges 11a, 11b, and 11c are respectively arranged midway along pipes extending from the source vessels 1a, 1b, and 1c to the MFCs 7a, 7b, and 7c. Alternatively, the pressure gauges 4a, 4b, and 4c directly connected to the source vessels 1a, 1b, and 1c may be used to measure the pressures of source gases in the source vessels 1a, 1b, and 1c.

In this case, the measurement values of source vapor pressures measured by the pressure gauges 4a, 4b, and 4c are fed back to the controllers 2a and 3a, the controllers 2b and 3b, and the controllers 2c and 3c, respectively.

The controller 2a and 3a control the temperature of the source vessel 1a based on the measurement value of the pressure gauge 4a so as to set the internal source vapor pressure of the source vessel 1a to a predetermined pressure. Similarly, the controllers 2b and 3b control the temperature of the source vessel 1b based on the measurement value of the pressure gauge 4b so as to set the internal source vapor pressure of the source vessel 1b to a predetermined pressure. The controllers 2c and 3c control the temperature of the source vessel 1c based on the measurement value of the pressure gauge 4c so as to set the internal source vapor pressure of the source vessel 1c to a predetermined pressure.

According to the first embodiment, the pressure gauges 4a, 4b, and 4c or the pressure gauges 11a, 11b, and 11c can be arranged to always stably supply sources and stably operate the MFCs 7a, 7b, and 7c.

In the above description, the pressure is measured as a parameter convertible into the number of moles of an organometallic source gas. This is equivalent to measurement of the number of moles (mol/m$^3$) per unit volume. As is apparent from the law of gases "pV=nRT" (p=the gas pressure, V=the volume, n=the number of moles, R=the gas constant, T=the absolute temperature), the number of moles is determined by obtaining the pressure p for constant volume and temperature. In the apparatus shown in FIG. 1, the internal volumes V of the source vessel 1a and gas pipe are constant. So long as the temperatures of the pipe and source vessel are constant, for example, the measurement value of the pressure gauge 4a is roportional to the molecular amount or number of moles per unit volume of Pb(DPM)$_2$ gas in the gas pipe.

To stably operate the MFC, a necessary differential pressure (e.g., 100 to 300 Pa) must be ensured between the input and output sides of the MFC. If the pressure (original pressure) on the input side of the MFC decreases to be equal to or lower than a necessary pressure, stable operation of the MFC is inhibited to disturb flow rate control by the MFC. For this reason, as the source in the source vessel is gasified and consumed, the amount of source in the source vessel gradually decreases to a given value or less, and a necessary source vapor pressure fails to obtain in an initial temperature setting state. As a result, the original pressure to the MFC decreases to disturb flow rate control by the MFC, and control of the source flow rate becomes unstable.

To solve the problem concerning the operation of the MFC, the first embodiment controls the vapor pressure of a source supplied to the MFC 7a, i.e., the original pressure of the MFC 7a on the basis of the measurement value of the pressure gauge 11a, as shown in FIG. 1. Since the first embodiment keeps the original pressure to the MFC at a necessary pressure or more even if the source in the source vessel decreases, the MFC can be stably operated.

Second Embodiment

FIG. 4 shows the second embodiment of an MOCVD apparatus (Metal Organic Chemical Vapor Deposition apparatus) according to the present invention. The same reference numerals as in FIG. 1 denote the same parts.

In the MOCVD apparatus shown in FIG. 4, a carrier gas is supplied to source vessels 1a, 1b, and 1c via valves 5a, 5b, and 5c in order to carry sources using the carrier gas.

A chemical vapor deposition process for a PZT film using the MOCVD apparatus shown in FIG. 4 will be described.

The source vessel 1a is heated to gasify a lead dipivaloyl methanato complex Pb(DPM)$_2$. At the same time, the source vessels 1b and 1c are heated to gasify organometallic compound sources Ti(O-i-Pr)$_4$ and Zr(O-t-Bu)$_4$.

A substrate 10 in an evacuated reactor 9 is heated to a predetermined temperature by a heater 9a.

Subsequently, the valve 5a is opened to introduce a carrier gas such as Ar or N$_2$ gas into the source vessel 1a, and a gas mixture of Pb(DPM)$_2$ gas and the carrier gas is introduced into the reactor 9 via a valve 6a, MFC 7a, and valve 8a. The valve 6b is opened to introduce a carrier gas into the source vessel 1b, and a gas mixture of Ti(O-i-Pr)$_4$ gas and the carrier gas is introduced into the reactor 9 via a valve 6b, MFC 7b, and valve 8b. The valve 5c is opened to introduce a carrier gas into the source vessel 1c, and a gas mixture of Zr(O-t-Bu)$_4$ gas and the carrier gas is introduced into the reactor 9 via a valve 6c, MFC 7c, and valve 8c. At the same time, NO$_2$ gas is also introduced into the reactor 9 via a valve 6d, MFC 7d, and valve 8d.

The flow rate of the gas mixture of Pb(DPM)$_2$ gas and the carrier gas, that of the gas mixture of Ti(O-i-Pr)$_4$ gas and the carrier gas, that of the gas mixture of Zr(O-t-Br)$_4$ gas and the carrier gas, and that of NO$_2$ gas are controlled by the MFCs 7a, 7b, 7c, and 7d, respectively.

As a result, a PZT film (PbZr$_x$Ti$_{1-x}$O$_3$ film) having a perovskite structure is formed on the substrate 10.

In the second embodiment, immediately after the chemical vapor deposition process ends, the valves 8a, 8b, 8c, and 8d are closed, and exhaust valves 12a, 12b, 12c, and 12d are opened to exhaust the gas mixture of the source and carrier gases and NO$_2$ oxide gas. Then, the substrate 10 having undergone chemical vapor deposition is unloaded from the reactor. The valves 5a, 5b, and 5c are closed to shield the carrier gas. Upon the lapse of a predetermined time, the valves 6a, 6b, and 6c are closed, and the internal source vapor pressures of the source vessels 1a, 1b, and 1c are measured by pressure gauges 4a, 4b, and 4c.

The measurement value of the pressure gauge 4a is fed back to the controllers 2a and 3a; that of the pressure gauge 4b, to the controllers 2b and 3b; and that of the pressure gauge 4c, to the controllers 2c and 3c.

The controllers 2a and 3a control the temperature of the source vessel 1a based on the measurement value of the pressure gauge 4a so as to set the internal source vapor pressure of the source vessel 1a to a predetermined pressure. Similarly, the controllers 2b and 3b control the temperature of the source vessel 1b based on the measurement value of the pressure gauge 4b so as to set the internal source vapor pressure of the source vessel 1b to a predetermined pressure. The controllers 2c and 3c control the temperature of the source vessel 1c based on the measurement value of the pressure gauge 4c so as to set the internal source vapor pressure of the source vessel 1c to a predetermined pressure.

While the temperatures of the source vessels 1a, 1b, and 1c are controlled, a substrate 10 subjected to next film formation is loaded to the reactor 9 to execute the above film formation process.

As described above, the second embodiment repeats the film formation process, measurement of the internal source vapor pressures of the source vessels 1a, 1b, and 1c, and temperature control of the source vessels 1a, 1b, and 1c every film formation process. By grasping the source flow rate in a previous process, the source can always be supplied stably.

A series of operations after film formation are executed while a film-formed substrate 10 is unloaded from the reactor, and a new substrate 10 is loaded into the reactor. Hence, the same productivity as in the prior art can be maintained.

Third Embodiment

Figure 5:
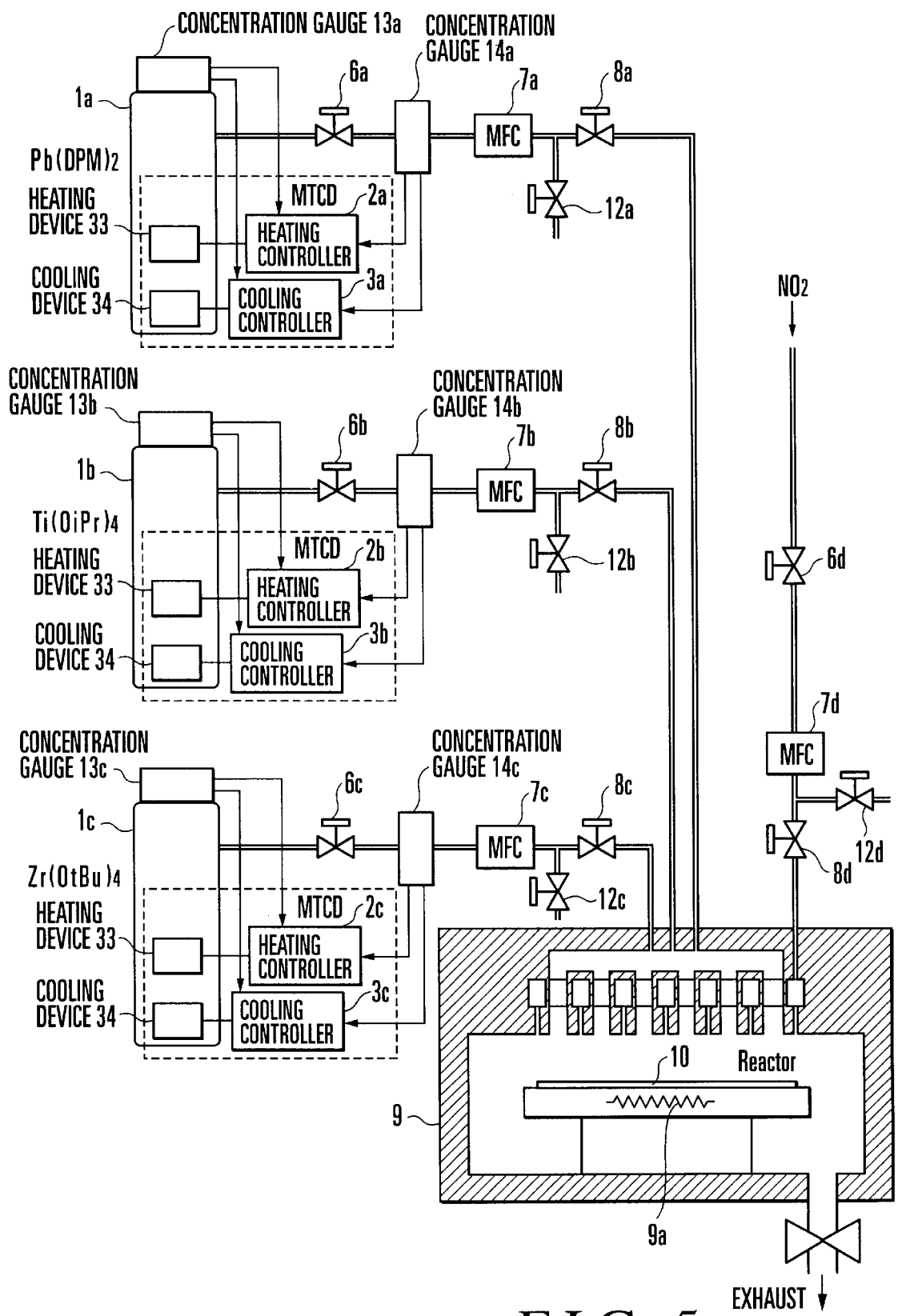
FIG. 5 is a system diagram showing the third embodiment for explaining the present invention.

FIG. 5 shows the third embodiment of an MOCVD apparatus according to the present invention. The internal temperature of the reactor is controlled by measuring the source concentration (kg/m$^3$) in the reactor or in the pipe extending from the reactor to the MFC. The same reference numerals as in FIG. 1 denote the same parts.

The embodiment of FIG. 5 adopts concentration gauges 13a, 13b, and 13c for measuring the internal source concentrations of source vessels 1a, 1b, and 1c, or concentration gauges 14a, 14b, or 14c for measuring the internal source concentrations of gas pipes between the source vessels 1a, 1b, and 1c and MFCs 7a, 7b, and 7c.

Figure 6A:
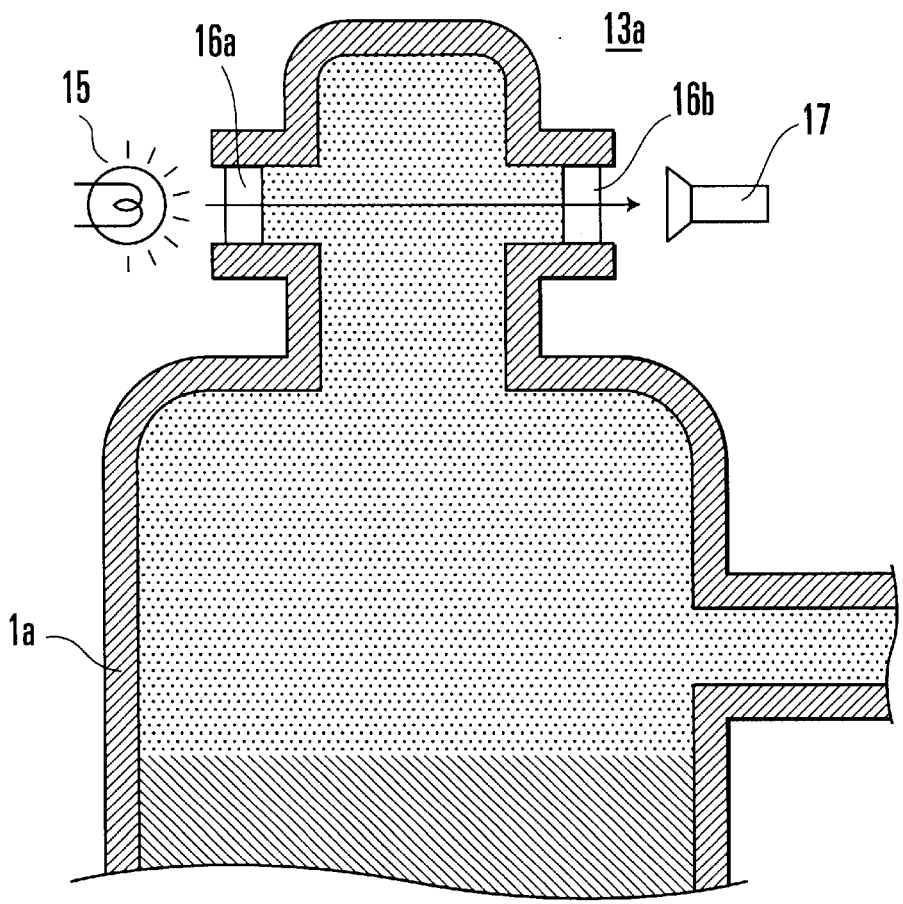
FIGS. 6A and 6B are sectional views each showing an example of a concentration gauge for measuring the concentration of a source gas.
Figure 6B:
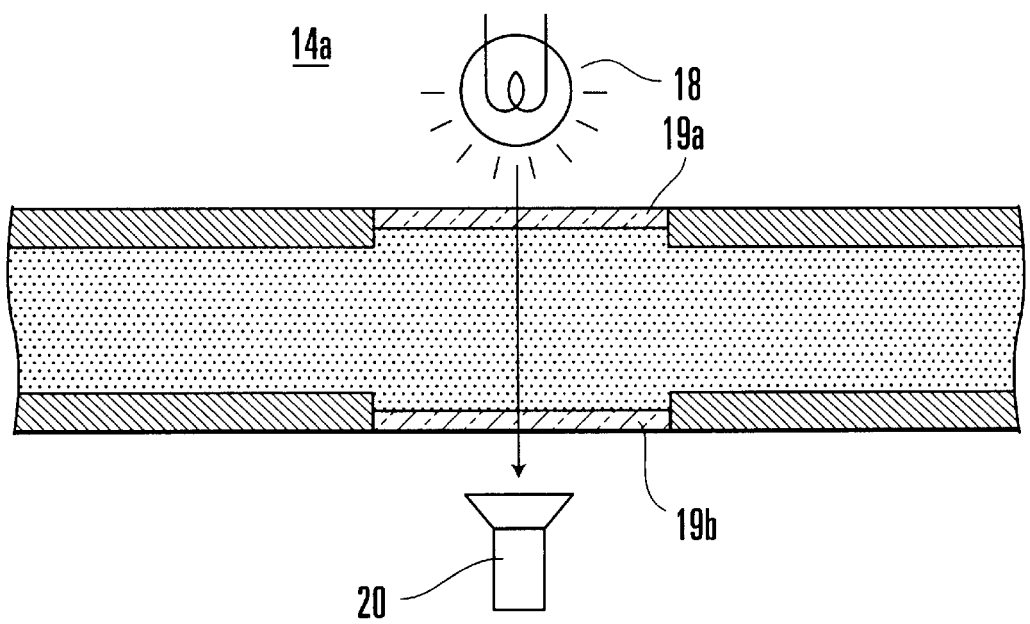

FIG. 6A shows a structure of the concentration gauges 13a, 13b, and 13c used in the embodiment of FIG. 5, and FIG. 6B shows a structure of the concentration gauges 14a, 14b, and 14c. FIG. 6A representatively shows the concentration gauge 13a, and FIG. 6B representatively shows the concentration gauge 14a.

The concentration gauge 13a shown in FIG. 6A comprises a light-emitting element 15 and a ight-receiving element 17. The light-emitting element 15 and the light-receiving element 17 are respectively attached to two windows 16a and 16b which are formed in the top of the source vessel 1a so as to face each other.

In the concentration gauge 13a shown in FIG. 6A, light emitted by the light-emitting element 15 comes from one window 16a of the source vessel 1a, and light emerging from the other opposite window 16b is received by the light-receiving element 17. Light absorption by a source gas present between the windows 16a and 16b in the source vessel 1a is measured to measure the source concentration. The structure of the concentration gauge 13a has been described, and this also applies to the remaining concentration gauges 13b and 13c.

The concentration gauge 14a shown in FIG. 6B comprises a light-emitting element 18, two windows 19a and 19b formed in a gas pipe between the source vessel 1a and the MFC 7a, and a light-receiving element 20.

In the concentration gauge 14a, light emitted by the light-emitting element 18 comes from one window 19a of the gas pipe, and light emerging from the other opposite window 19b is received by the light-receiving element 20. Light absorption by a source gas in the gas pipe is measured to measure the source concentration. The structure of the concentration gauge 14a has been described, and this also applies to the concentration gauges 14b and 14c. Light may be transmitted between the light-emitting element and the window and between the window and the light-receiving element via transmission means such as optical fibers.

Also in the third embodiment, the film formation process is the same as in the first embodiment.

The measurement value of the concentration gauge 13a is fed back to controllers 2a and 3a; that of the concentration gauge 13b, to controllers 2b and 3b; and that of the concentration gauge 13c, to controllers 2c and 3c.

The controllers 2a and 3a control the temperature of the source vessel 1a based on the measurement value of the concentration gauge 13a so as to set the source concentration in the source vessel 1a to a predetermined value. The controllers 2b and 3b control the temperature of the source vessel 1b based on the measurement value of the concentration gauge 13b so as to set the source concentration in the source vessel 1b to a predetermined value. The controllers 2c and 3c control the temperature of the source vessel 1c based on the measurement value of the concentration gauge 13c so as to set the source concentration in the source vessel 1c to a predetermined value.

When the concentration gauges 14a, 14b, and 14c are arranged, the measurement value of the concentration gauge 14a is fed back to the controllers 2a and 3a; that of the concentration gauge 14b, to the controllers 2b and 3b; and that of the concentration gauge 14c, to the controllers 2c and 3c.

The controllers 2a and 3a control the temperature of the source vessel 1a based on the measurement value of the concentration gauge 14a so as to set the source concentration in the source vessel la to a predetermined value. The controllers 2b and 3b control the temperature of the source vessel 1b based on the measurement value of the concentration gauge 14b so as to set the source concentration in the source vessel 1b to a predetermined value. The controllers 2c and 3c control the temperature of the source vessel 1c based on the measurement value of the concentration gauge 14c so as to set the source concentration in the source vessel 1c to a predetermined value.

Accordingly, the same effects as those of the first embodiment can be obtained.

In the third embodiment, the source concentration (kg/m$^3$) is measured as a parameter convertible into the number of moles of an organometallic source gas. This is equivalent to measurement of the number of moles (mol/m$^3$) per unit volume. The mass per mol of a substance is uniquely determined for the substance. That is, the mass per mol of a source in use is unique to the source. Thus, the source concentration as the mass per unit volume corresponds to the molecular amount or number of moles per unit volume of the source gas in the gas pipe.

Fourth Embodiment

Figure 7:
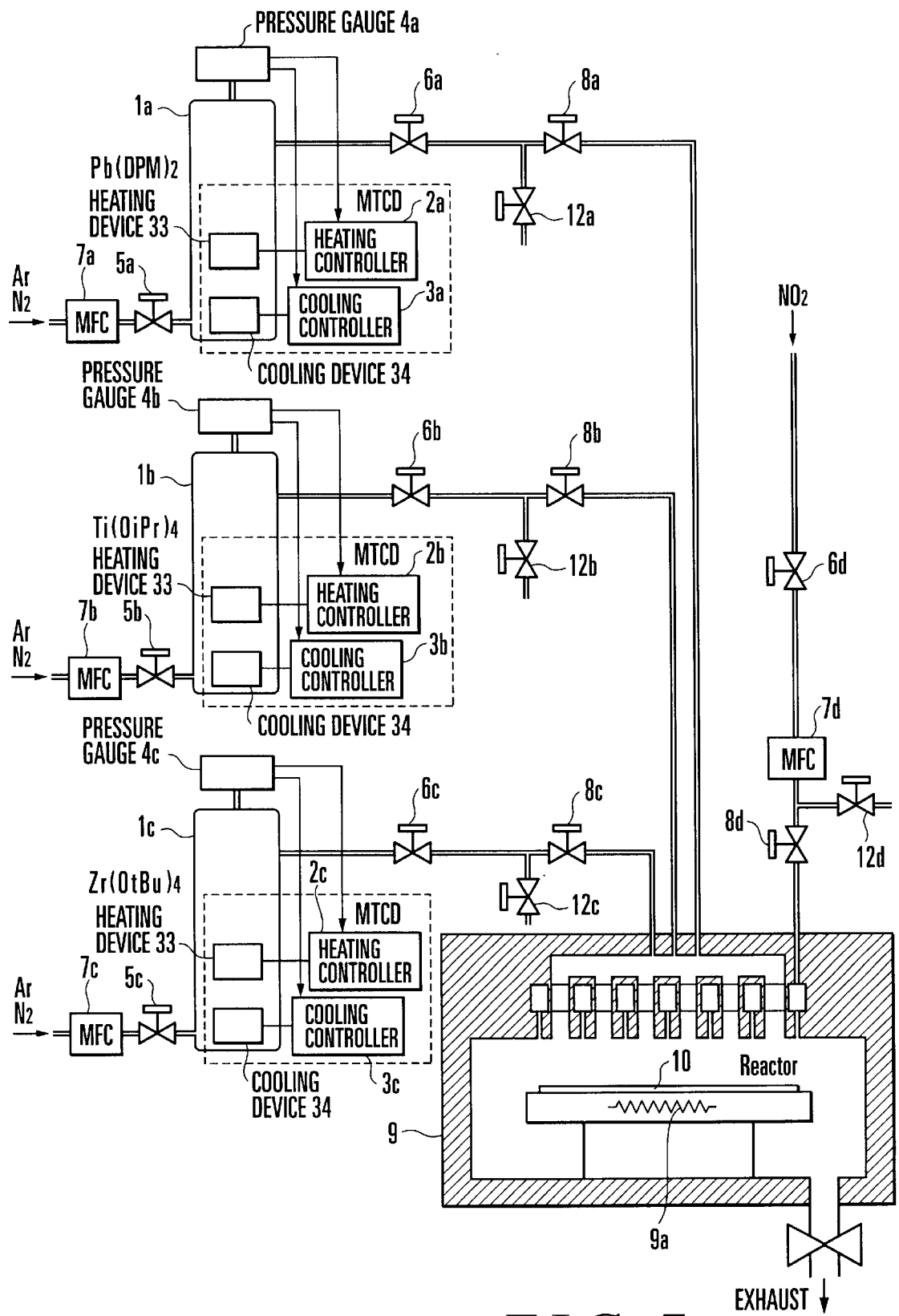
FIG. 7 is a system diagram showing the fourth embodiment for explaining the present invention.
Figure 8:
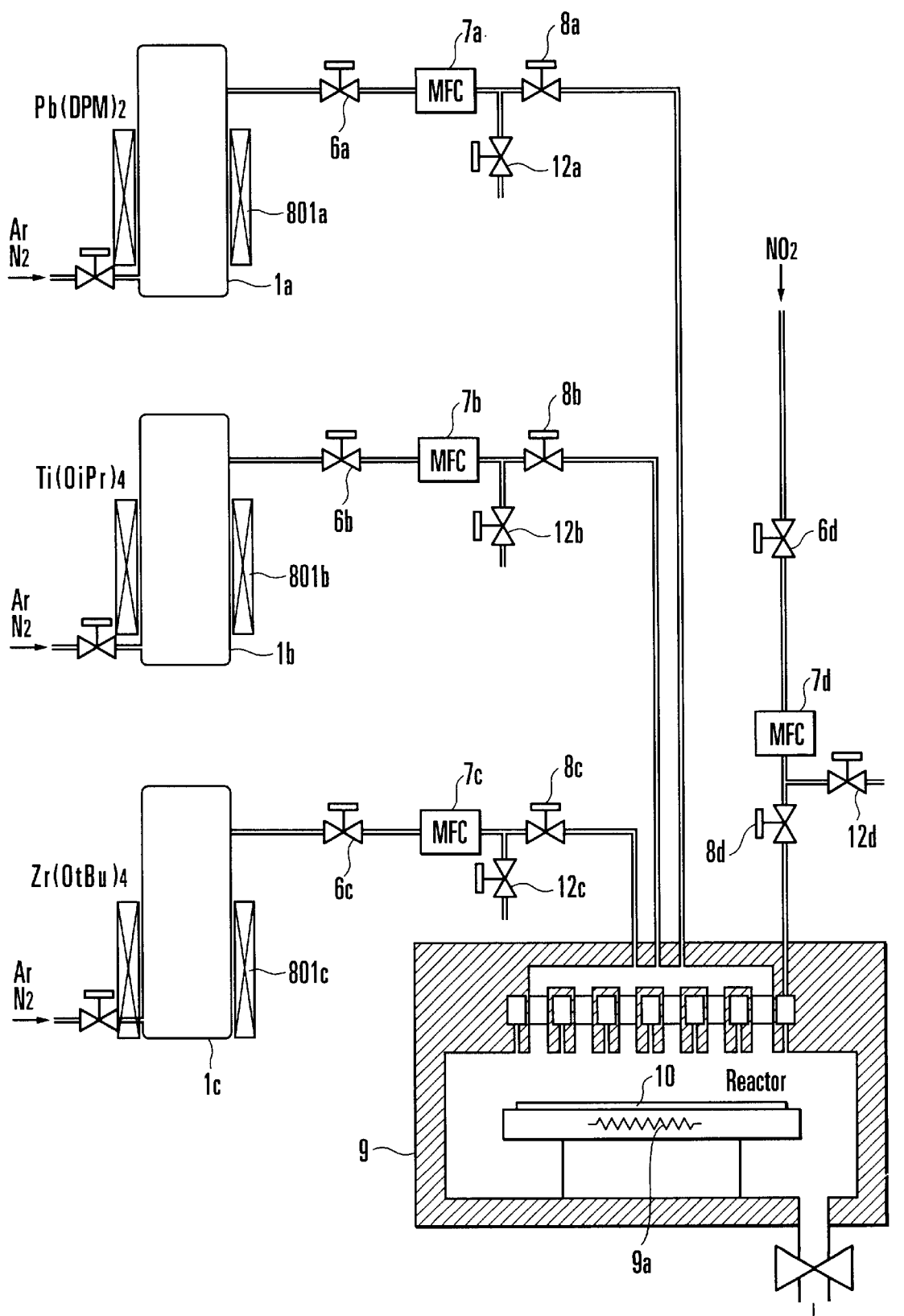
FIG. 8 is a system diagram showing the arrangement of a conventional chemical vapor deposition apparatus.
Figure 9:
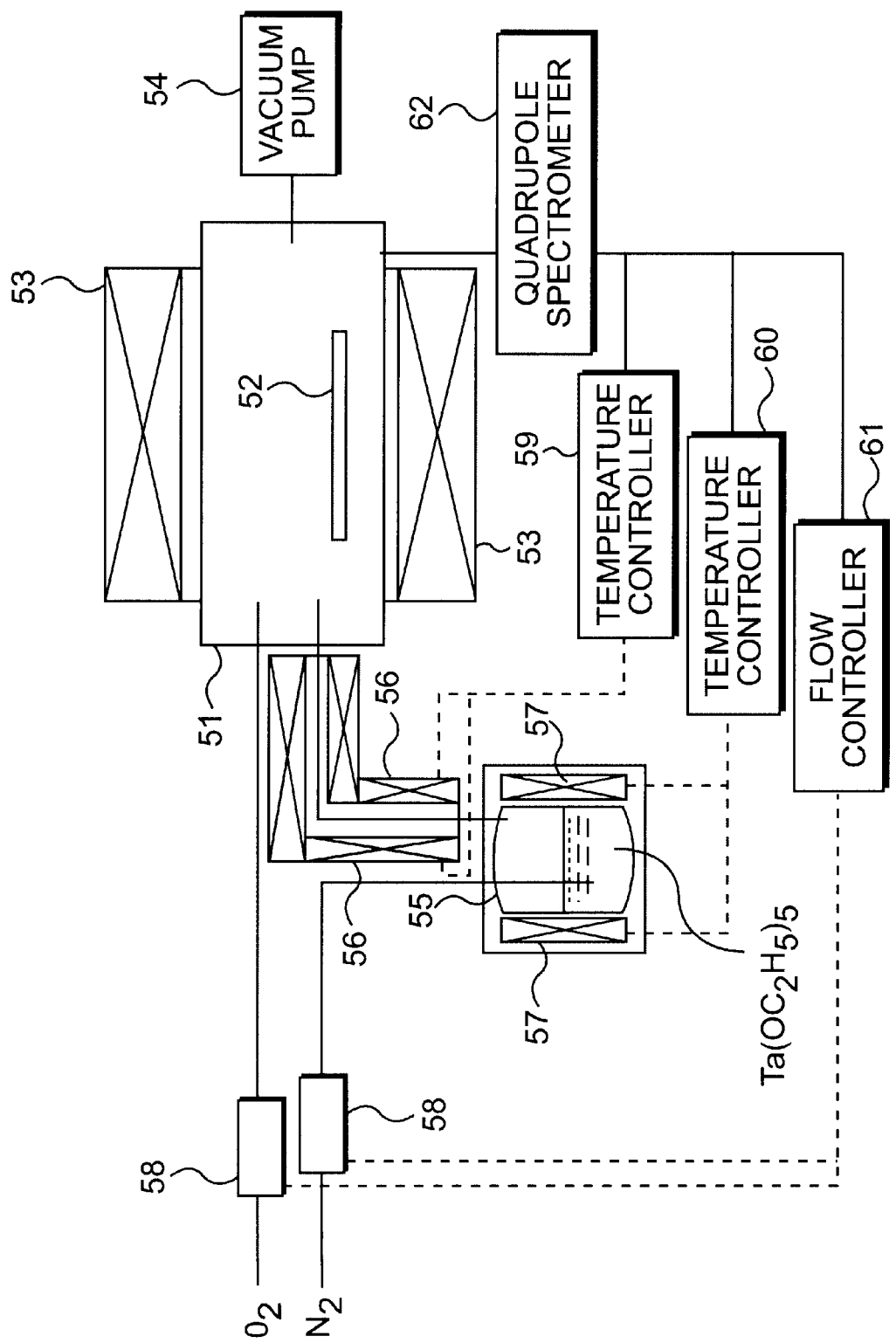
FIG. 9 is a system diagram showing the arrangement of another conventional chemical vapor deposition apparatus.

FIG. 7 shows the basic arrangement of the fourth embodiment for explaining an MOCVD apparatus (Metal Organic Chemical Vapor Deposition apparatus) according to the fourth embodiment of the present invention. The same reference numerals as in FIG. 4 denote the same parts.

In the MOCVD apparatus shown in FIG. 7, a carrier gas is supplied to the carrier gas inlets of source vessels 1a, 1b, and 1c via valves 5a, 5b, and 5c in order to carry (supply) sources using the carrier gas. The MOCVD apparatus is different from that shown in FIG. 4 in that MFCs 7a, 7b, and 7c are arranged upstream of the valves 5a, 5b, and 5c attached to the carrier gas inlets.

A film formation process for a PZT film using the MOCVD apparatus shown in FIG. 7 will be described.

The source vessel 1a is heated to gasify a lead dipivaloyl methanato complex Pb(DPM)$_2$. At the same time, the source vessels 1b and 1c are heated to gasify organometallic compound sources Ti(O-i-Pr)$_4$ and Zr (O-t-Bu)$_4$.

A substrate 10 in an evacuated reactor 9 is heated to a predetermined temperature by a heater 9a.

Subsequently, the valve 5a is opened to introduce a carrier gas such as Ar or N$_2$ gas into the source vessel 1a via the MFC 7a, and a gas mixture of Pb(DPM)$_2$ gas and the carrier gas is introduced into the reactor 9 via valves 6a and 8a. The valve 5b is opened to introduce a carrier gas into the source vessel 1b via the MFC 7b, and a gas mixture of Ti(O-i-Pr)$_4$ gas and the carrier gas is introduced into the reactor 9 via valves 6b and 8b. At the same time, the valve 5c is opened to introduce a carrier gas into the source vessel 1c via the MFC 7c, and a gas mixture of Zr(O-t-Bu)$_4$ gas and the carrier gas is introduced into the reactor 9 via valves 6c and 8c. At the same time, NO$_2$ gas is introduced into the reactor 9 via a valve 6d, MFC 7d, and valve 8d.

The flow rate of the gas mixture of Pb(DPM)$_2$ gas and the carrier gas, that of the gas mixture of Ti (O-i-Pr)$_4$ gas and the carrier gas, that of the gas mixture of Zr(O-t-Br)$_4$ gas and the carrier gas, and that of NO$_2$ gas are respectively controlled by the MFCs 7a, 7b, 7c, and 7d in consideration of characteristics demanded for a PZT film to be formed on the substrate 10.

As a result, a PZT film (PbZr$_x$Ti$_{1-x}$O$_3$ film) having a perovskite structure is formed on the substrate 10.

In the fourth embodiment, immediately after the film formation process ends, the valves 8a, 8b, 8c, and 8d are closed, and exhaust valves 12a, 12b, 12c, and 12d are opened to discharge the gas mixture of the source and carrier gases and NO$_2$ oxide gas. Then, the film-formed substrate 10 is unloaded from the reactor 9. After the substrate 10 is unloaded, the valves 5a, 5b, and 5c are closed to stop supplying the carrier gas. Upon the lapse of a predetermined time, the valves 6a, 6b, and 6c are closed, and the internal source vapor pressures of the source vessels 1a, 1b, and 1c are measured by pressure gauges 4a, 4b, and 4c.

The measurement value of the pressure gauge 4a is fed back to controllers 2a and 3a; that of the pressure gauge 4b, to controllers 2b and 3b; and that of the pressure gauge 4c, to controllers 2c and 3c.

The controllers 2a and 3a control the temperature of the source vessel 1a based on the measurement value of the pressure gauge 4a so as to set the internal source vapor pressure of the source vessel la to a predetermined pressure. Similarly, the controllers 2b and 3b control the temperature of the source vessel 1b based on the measurement value of the pressure gauge 4b so as to set the internal source vapor pressure of the source vessel 1b to a predetermined pressure. The controllers 2c and 3c control the temperature of the source vessel 1c based on the measurement value of the pressure gauge 4c so as to set the internal source vapor pressure of the source vessel 1c to a predetermined pressure.

While the temperatures of the source vessels 1a, 1b, and 1c are controlled, a substrate 10 subjected to next film formation is loaded to the reactor 9 to execute the above film formation process.

As described above, the fourth embodiment repeats the film formation process, measurement of the internal source vapor pressures of the source vessels 1a, 1b, and 1c, and temperature control of the source vessels 1a, 1b, and 1c every film formation process. This allows always supplying the source stably.

In the fourth embodiment, the MFCs 7a, 7b, and 7c are arranged upstream of the valves 5a, 5b, and 5c attached to the carrier gas inlets. Compared to the MOCVD apparatus in FIG. 4, the MOCVD apparatus in FIG. 7 has the following advantages. In the MOCVD apparatus of FIG. 4, the MFC must be heated to the same temperature as the source vessel in order to maintain the source vapor pressure. To the contrary, the MFC of the fourth embodiment only controls the flow rate of the carrier gas, and thus need not be heated to a high temperature. To obtain a necessary source vapor pressure, the source vessel, and the pipe extending from the source vessel to the reactor may be inevitably heated to 200° C. or more. However, the MFC heating temperature of 200° C. degrades the precision and stability of the MFC. For this reason, by arranging the MFCs 7a, 7b, and 7c upstream of the valves 5a, 5b, and 5c attached to the carrier gas inlets, like the MOCVD apparatus in FIG. 7, the source can be stably supplied at higher precision than the MOCVD apparatus in FIG. 4.

A series of operations after film formation are executed while a film-formed substrate 10 is unloaded from the reactor, and a new substrate 10 is loaded into the reactor. Thus, the same productivity as in the prior art can be maintained. This is the same as the MOCVD apparatus in FIG. 4.

Although a PZT film is formed on the substrate 10 in the above embodiments, the present invention can also be applied to formation of another thin film.

As has been described above, according to the present invention, a parameter convertible into the number of moles of an organometallic source gas in a gas pipe between a source vessel and a mass-flow controller or in the source vessel is detected, and the source is heated based on the detected value. The source gas can be quantitatively supplied to the reactor. Consequently, the mass-flow controller can always be operated stably to always supply the source stably.

In the conventional apparatus, the temperature of the source vessel is set to a constant value. As the amounts of sources in the source vessels 1a, 1b, and 1c decrease, the flow rates of the source gases decrease, resulting in unstable source supply. To the contrary, the present invention can stably supply the source, and can solve the problem of the conventional apparatus.

The flow rate of the source gas is controlled by the mass-flow controller, and the source vapor pressure in the gas pipe or the source vessel is measured to control the temperature of the source vessel. From this, the present invention can implement a more practical source supply apparatus than the chemical vapor deposition apparatus disclosed in Japanese Patent Laid-Open No. 4-362176. The present invention can, therefore, provide uniform CVD film formation with high reproducibility.

When the source gas is to be carried by the carrier gas to the reactor, valves attached to the gas inlet and outlet of the source vessel are closed every time the film formation process ends. Then, the internal source vapor pressure of the source vessel is measured, and the temperature of the source vessel is controlled based on the measurement value so as to set the source vapor pressure to a predetermined pressure. This enables always keeping the internal source vapor pressure of the source vessel constant. Even if the source gas is carried by the carrier gas to the reactor, the source can always be supplied stably. Moreover, the flow rate of the source gas is controlled by the mass-flow controller, and the internal source vapor pressure of the source vessel is measured to control the temperature of the source vessel. The present invention can implement a more practical source supply apparatus than the chemical vapor deposition apparatus disclosed in Japanese Patent Laid-Open No. 4-362176. Consequently, the present invention can provide uniform CVD film formation with high reproducibility.

What is claimed is:

1. A metal organic chemical vapor deposition apparatus comprising:
   at least one source vessel containing a source for organometallic gas;
   a gas pipe for supplying the gas from the source vessel to a reactor;
   means for measuring a parameter of the gas prior to entering the reactor, the parameter being convertible into mole quantity of the gas; and
   source temperature adjustment means for adjusting the temperature of the source in the source vessel, comprising heating and cooling devices configured to operate in such a manner that the temperature of the organometallic source in the source vessel is adjusted according to a predetermined condition associated with the measured parameter of the gas.

2. An apparatus according to claim 1, wherein the detection means comprises a pressure gauge for detecting a pressure of the gas.

3. An apparatus according to claim 2, wherein the pressure gauge is connected to the source vessel to measure the pressure of the gas in the source vessel.

4. An apparatus according to claim 2, wherein the pressure gauge is connected to a portion of the gas pipe to measure the pressure of the gas in the pipe.

5. An apparatus according to claim 1, wherein the detection means comprises a concentration gauge for detecting a concentration of the gas.

6. An apparatus according to claim 5, wherein the concentration gauge measures a light absorption characteristic of the gas.

7. An apparatus according to claim 6, wherein the concentration gauge is connected to the source vessel and comprises light-emitting means and light-receiving means, wherein the light emitted by the light-emitting means passes through the gas in an upper portion of the source vessel and is received by the light-receiving means, thereby measuring the light absorption characteristic of the gas.

8. An apparatus according to claim 6, wherein the concentration gauge comprises light-emitting means and light-receiving means and is arranged on a portion of the gas pipe, wherein the light emitted by the light-emitting means passes through the gas in the pipe and is received by the light-receiving means, thereby measuring the light absorption characteristic of the gas.

9. An apparatus according to claim 5, wherein the concentration gauge is connected to the source vessel to measure the concentration of the gas in the source vessel.

10. An apparatus according to claim 5, wherein the concentration gauge is arranged on a portion of the gas pipe to detect the concentration of the gas in the pipe.

11. An apparatus according to claim 1, wherein the source for organometallic gas comprises at least one of $Pb(DPM)_2$, $Ti(OiPr)_4$, and $Zr(OtBu)_4$.

12. An apparatus according to claim 1, comprising a mass flow controller for controlling the flow rate of the gas supplied to the reactor, the mass flow controller placed on a portion of the gas pipe.

13. An apparatus according to claim 1, comprising at least one valve placed on a portion of the gas pipe for controlling the flow of the gas.

14. A metal organic chemical vapor deposition apparatus comprising:
    at least one source vessel containing a source for organometallic gas;
    a gas pipe for supplying the gas from the source vessel to a reactor;
    detection means for measuring a parameter of the gas in the source vessel, the parameter being convertible to mole quantity of the gas; and
    source temperature adjustment means for adjusting the temperature of the organometallic gas source, comprising heating and cooling devices configured to operate in such a manner that the temperature of the organometallic gas source is adjusted according to a predetermined condition associated with the measured parameter of the gas.

15. An apparatus according to claim 14, wherein the detection means comprises a pressure gauge for detecting a pressure of the gas in the source vessel.

16. An apparatus according to claim 14, wherein the detection means comprises a concentration gauge for detecting a concentration of the gas in the source vessel.

17. An apparatus according to claim 16, wherein the concentration gauge measures a light absorption characteristic of the gas.

18. An apparatus according to claim 14, wherein the source for organometallic gas comprises at least one of $Pb(DPM)_2$, $Ti(OiPr)_4$, and $Zr(OtBu)_4$.

19. An apparatus according to claim 14, comprising a mass flow controller for controlling the flow rate of the gas supplied to the reactor, the mass flow controller placed on a portion of the gas pipe.

20. An apparatus according to claim 14, comprising at least one valve placed on a portion of the gas pipe for controlling the flow of the gas.

* * * * *

UNITED STATES PATENT AND TRADEMARK OFFICE
CERTIFICATE OF CORRECTION

PATENT NO.    : 6,482,266 B1
DATED         : November 19, 2002
INVENTOR(S)   : Kenji Matsumoto et al.

It is certified that error appears in the above-identified patent and that said Letters Patent is hereby corrected as shown below:

Column 13,
Line 16, before "means" insert -- detection --.

Signed and Sealed this

Ninth Day of November, 2004

JON W. DUDAS
*Director of the United States Patent and Trademark Office*